US012707608B2

(12) United States Patent
DeVries

(10) Patent No.: US 12,707,608 B2
(45) Date of Patent: Aug. 11, 2026

(54) HARDROOM DOOR EDGE SEAL

(71) Applicant: Faraday Defense Corporation, Kalamazoo, MI (US)

(72) Inventor: Jason R DeVries, Kalamazoo, MI (US)

(73) Assignee: Faraday Defense Corporation

( * ) Notice: Subject to any disclaimer, the term of this patent is extended or adjusted under 35 U.S.C. 154(b) by 99 days.

(21) Appl. No.: 18/936,937

(22) Filed: Nov. 4, 2024

(65) Prior Publication Data

US 2026/0129817 A1 May 7, 2026

(51) Int. Cl.

*H05K 9/00* (2006.01)
*E06B 5/10* (2006.01)
*E06B 7/232* (2006.01)
*E04B 1/92* (2006.01)

(52) U.S. Cl.

CPC ............. *H05K 9/0001* (2013.01); *E06B 5/10* (2013.01); *E06B 7/232* (2013.01); *H05K 9/0015* (2013.01); *E04B 1/92* (2013.01); *E04B 2001/925* (2013.01)

(58) Field of Classification Search

CPC .......................... H05K 9/0001; H05K 9/0015
See application file for complete search history.

(56) References Cited

U.S. PATENT DOCUMENTS 5,353,029 A * 10/1994 Johnston ................ H01Q 17/00 342/4
8,393,115 B2 * 3/2013 Schroder ............... E06B 7/2305 49/504
8,492,660 B2 * 7/2013 Carducci ............. H05K 9/0001 49/467
11,917,800 B1 * 2/2024 Kim ..................... H05K 9/0005
2004/0129438 A1 * 7/2004 Christou .............. H05K 9/0015 174/382
2015/0152679 A1 * 6/2015 Kolobayev ............... E06B 5/18 49/305
2018/0027706 A1 * 1/2018 Winch ................ H05K 9/0003 174/382
2019/0032392 A1 * 1/2019 Cordes .................... F41H 5/013

FOREIGN PATENT DOCUMENTS

WO WO2006090958 A1 8/2006

* cited by examiner

*Primary Examiner* — Hung V Ngo
(74) *Attorney, Agent, or Firm* — Patents and Licensing LLC; Daniel W. Juffernbruch

(57) ABSTRACT

A pair of fabric EMI gaskets run in parallel and adhered onto a perimeter of a conductive ferrous hardroom door surface. A row of magnets running in between the pair of fabric EMI gaskets is magnetically adhered onto the perimeter of the door surface. A series of conductive non-ferrous spring clips are inserted between the pair of fabric EMI gaskets in at least corners of conductive ferrous hardroom door surface. A strip of felted wool is deployed above the non-ferrous spring clips and the row of magnets. A cam lever rotatably attached between the hardroom door pries open and breaks magnetic forces between the row of magnets and a conductive ferrous surface of a door frame.

24 Claims, 7 Drawing Sheets

HARDROOM DOOR EDGE SEAL

BACKGROUND OF THE INVENTIONS

1. Technical Field

The present inventions relate to electromagnetically shielded rooms and, more particularly, relate to door seals for electromagnetically shielded rooms.

2. Description of the Related Art

Doors for electromagnetically shielded rooms are known with seals that seek to block electromagnetic energy from leaking into the room. What is needed is useful improvements to door seal technology that prevent leakage.

BRIEF DESCRIPTION OF THE DRAWINGS

The present inventions are illustrated by way of example and are not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein.

DETAILED DESCRIPTION OF THE PREFERRED EMBODIMENTS

Figure 1:
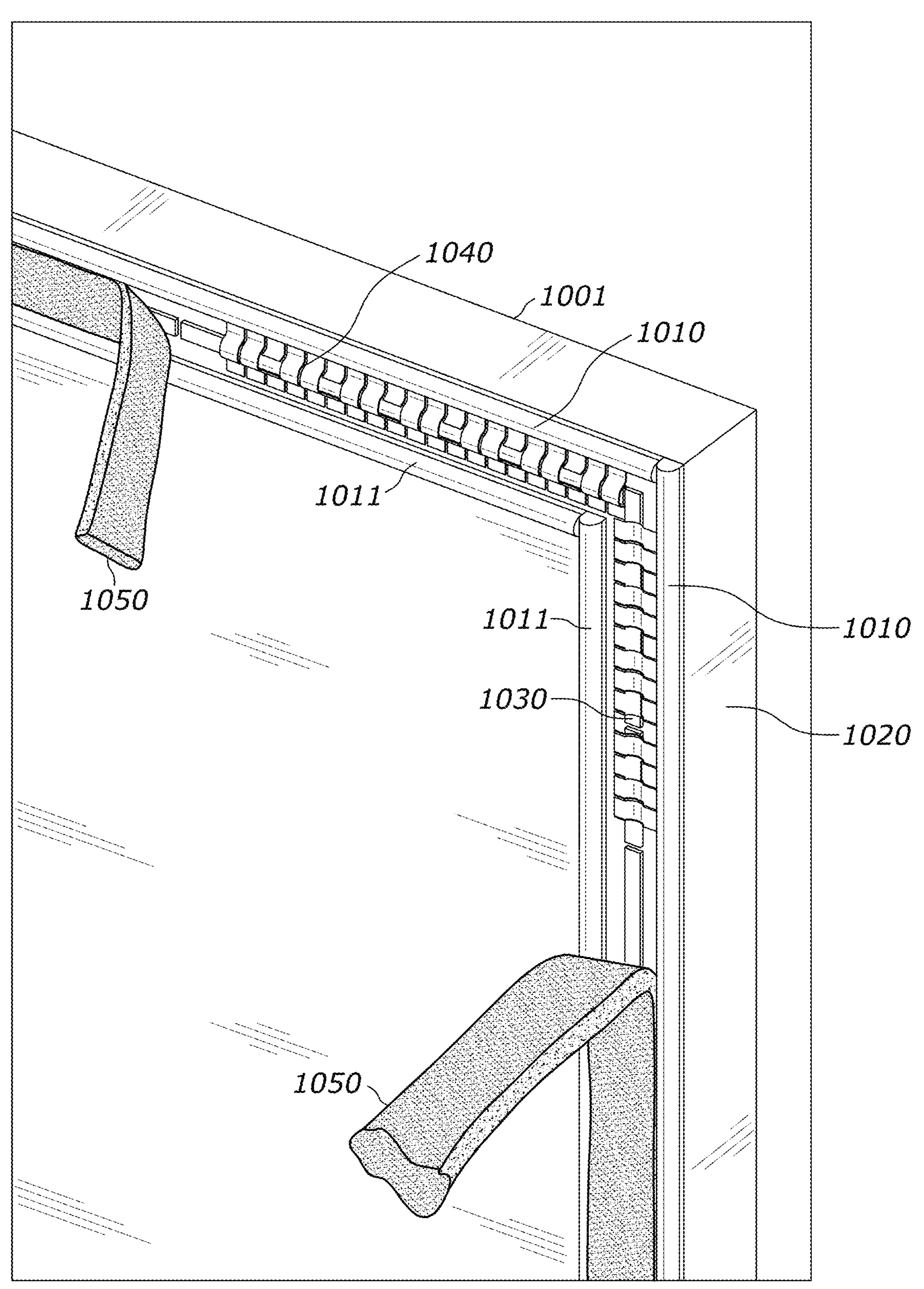
FIG. 1 illustrates a perspective cutaway view of a hardroom door at an inside corner with a gasket according to embodiments of the present inventions.

FIG. 1 illustrates a perspective cutaway view of a hardroom door 1001 at an inside corner with a gasket 1010 according to embodiments of the present inventions.

An edge seal for a hardroom door 1001 in an electromagnetic shielded enclosure is illustrated. A pair of fabric EMI gaskets 1010 (outer) and 1011(inner) run in parallel and adhered onto a perimeter of a conductive ferrous hardroom door surface 1020. A row of magnets 1030 runs between the pair of fabric EMI gaskets 1010 (outer) and 1011 (inner). It is magnetically adhered onto the perimeter of the conductive ferrous hardroom door surface 1020. A series of conductive, non-magnetic, non-ferrous copper, spring clips 1040 are inserted between the pair of fabric EMI gaskets 1010 and 1011 in at least corners of conductive ferrous hardroom door surface 1020, radiating about 12 inches (30.5 centimeters) from each corner in both directions. The spring clips help keep steel wool from sliding. Magnetic clips would reduce strength of magnet, so the spring clips are a conductive non-ferrous material such as copper. Strips of felted steel wool 1050 is deployed above the conductive non-ferrous spring clips 1040 and the row of magnets 1030.

The row of magnets 1030 holds the felted wool 1050. Glue adheres the pair of fabric EMI gaskets 1010, 1011 onto the perimeter of the conductive ferrous hardroom door surface 1020. The conductive non-ferrous spring clips 1040 are curved about 180 degrees to fit held between the row of magnets 1030 on a side and the conductive ferrous hardroom door surface 1020 on the other and extend around with a spring to another, opposite side of the row of magnets. A door closing dampener can be added to prevent dangerous magnetic attraction door slamming and pinching.

Figure 2:
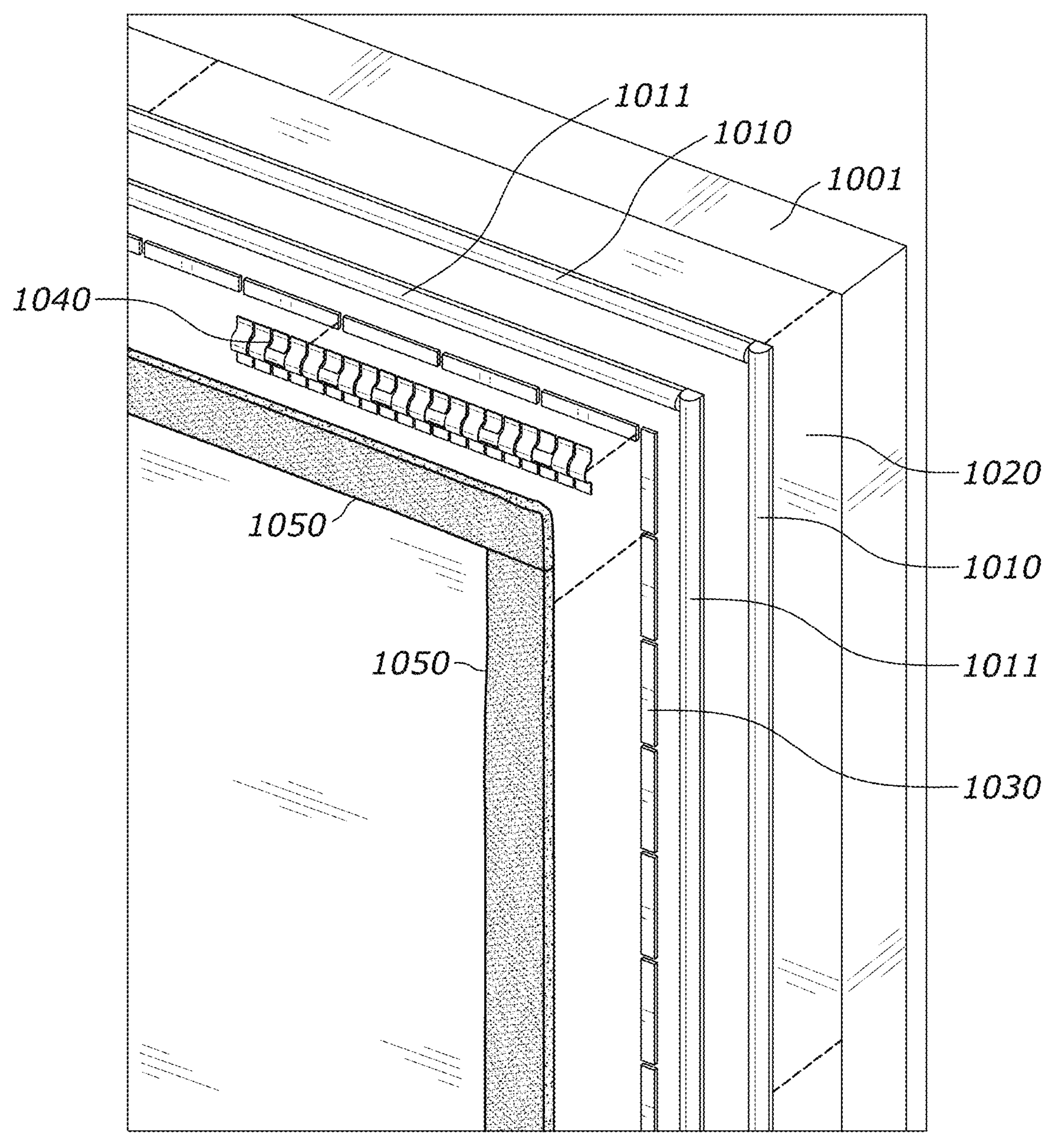
FIG. 2 illustrates an exploded perspective cutaway view of a door at an inside corner with a gasket according to embodiments of the present inventions.

FIG. 2 illustrates an exploded perspective cutaway view of a door 1001 at an inside corner with EMF gaskets 1010 and 1011 according to embodiments of the present inventions. Exploded view shows layering of magnets 1030, conductive non-ferrous copper spring clips 1040, and strips of felted steel wool 1050, from bottom to top.

Figure 3:
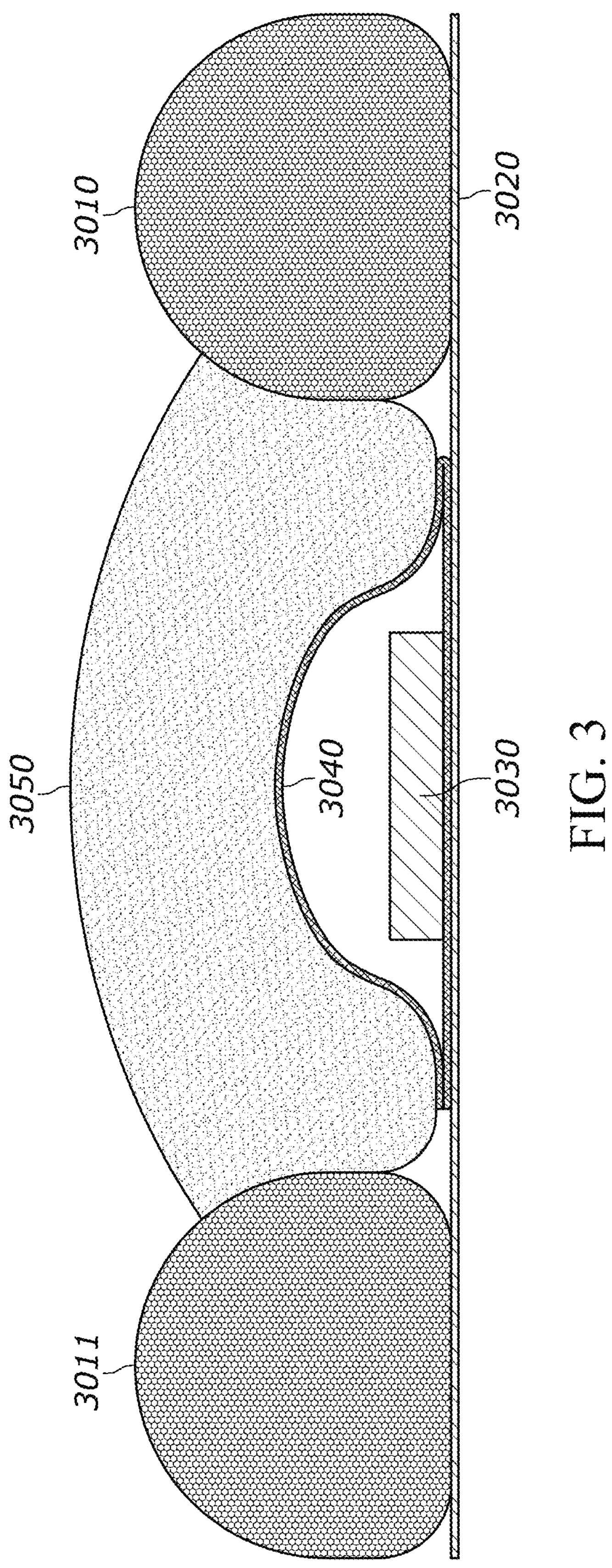
FIG. 3 illustrates a cutaway view of the gasket in FIG. 1 according to embodiments of the present inventions.

FIG. 3 illustrates a cutaway view of the gasket 3010, outer, and 3011, inner in FIG. 1 according to embodiments of the present inventions. The strip of felted steel wool 3050 is layered vertically in-between outer gasket 3010 and inner gasket 3011. Outer gasket 3010 and inner gasket 3011 are attached to conductive ferrous surface 3020. Directly below felted steel wool 3050 is the top surface of conductive non-ferrous copper spring clip 3040. Copper spring clip 3040 folds 180 degrees around to lay beneath magnet 3030, touching conductive ferrous surface 3020.

Figure 4:
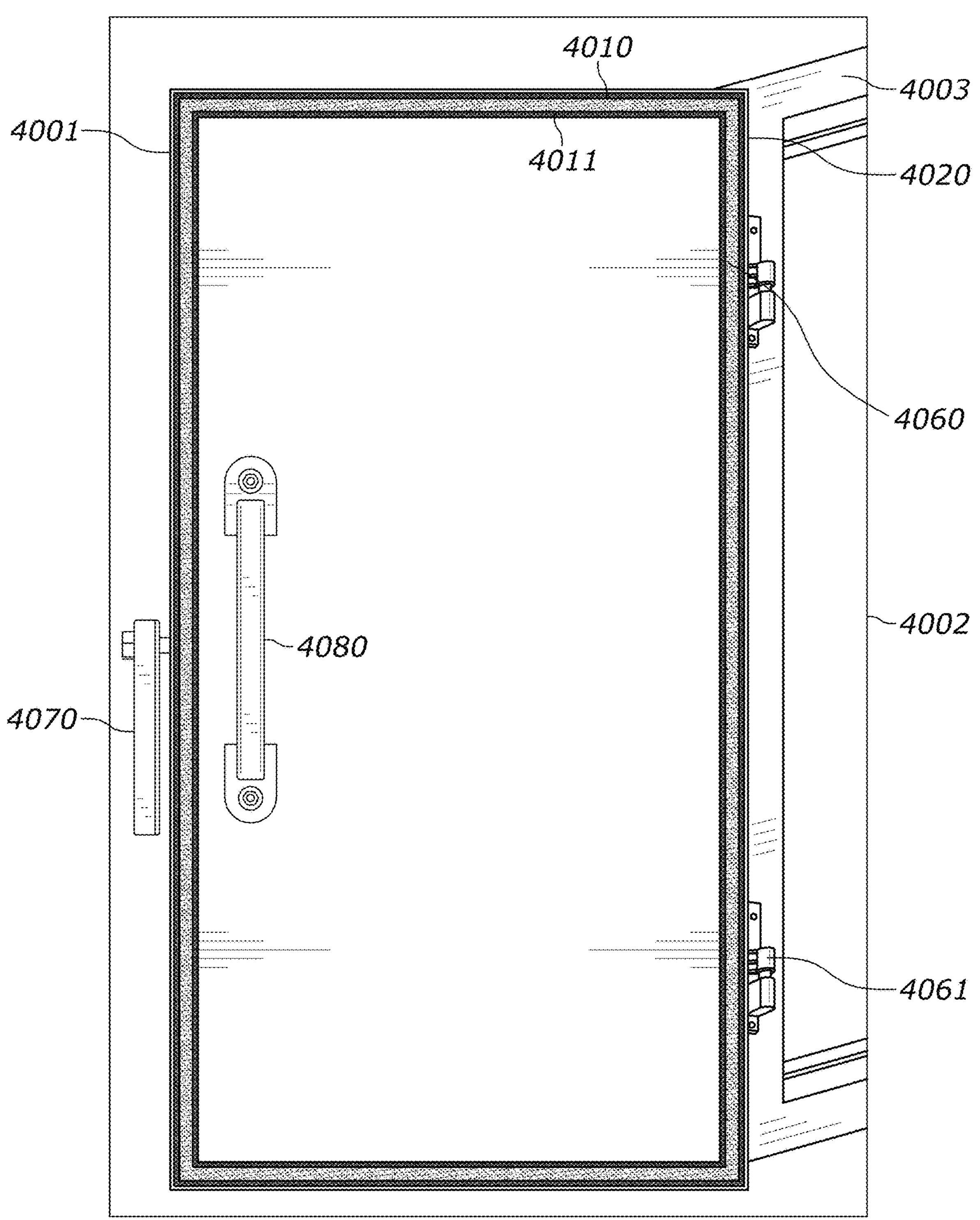
FIG. 4 illustrates a perspective cutaway view a back of the hardroom door with the gasket hinged to a door frame of a hardroom electromagnetic enclosure according to embodiments of the present inventions.

FIG. 4 illustrates a perspective cutaway view of a back of the hardroom door 4001 with the gasket pair 4010 and 4011 hinged to a door frame 4003 of a hardroom electromagnetic enclosure 4002 according to embodiments of the present inventions. The door frame 4003 is made of or covered with a conductive ferrous material so it is attracted to a magnet. The edge seal including EMI gaskets 4010, 4011 for a hardroom door 4001 is in an electromagnetic shielded enclosure 4002 that has a door frame 4003 having a conductive ferrous surface material 4020. The hardroom door 4001 has a row of magnets around a perimeter thereof and hinges 4060, 4061 coupling an edge of the hard room door 4001 to the door frame 4003. An interior pull handle 4080 is attached to the interior surface of hardroom door 4001.

A cam lever 4070 is rotatably attached to a side edge of the hardroom door 4001, located on the side opposite of the hinges 4061 and 4061. The row of magnets 4030 creates at least about 200 lbs. force needing special handle to open the door such as with the cam lever 4070. The cam lever 4070 allows a user to pry open and break magnetic forces between the row of magnets 4030 and the door frame 4003 having a conductive ferrous surface material.

Figure 5:
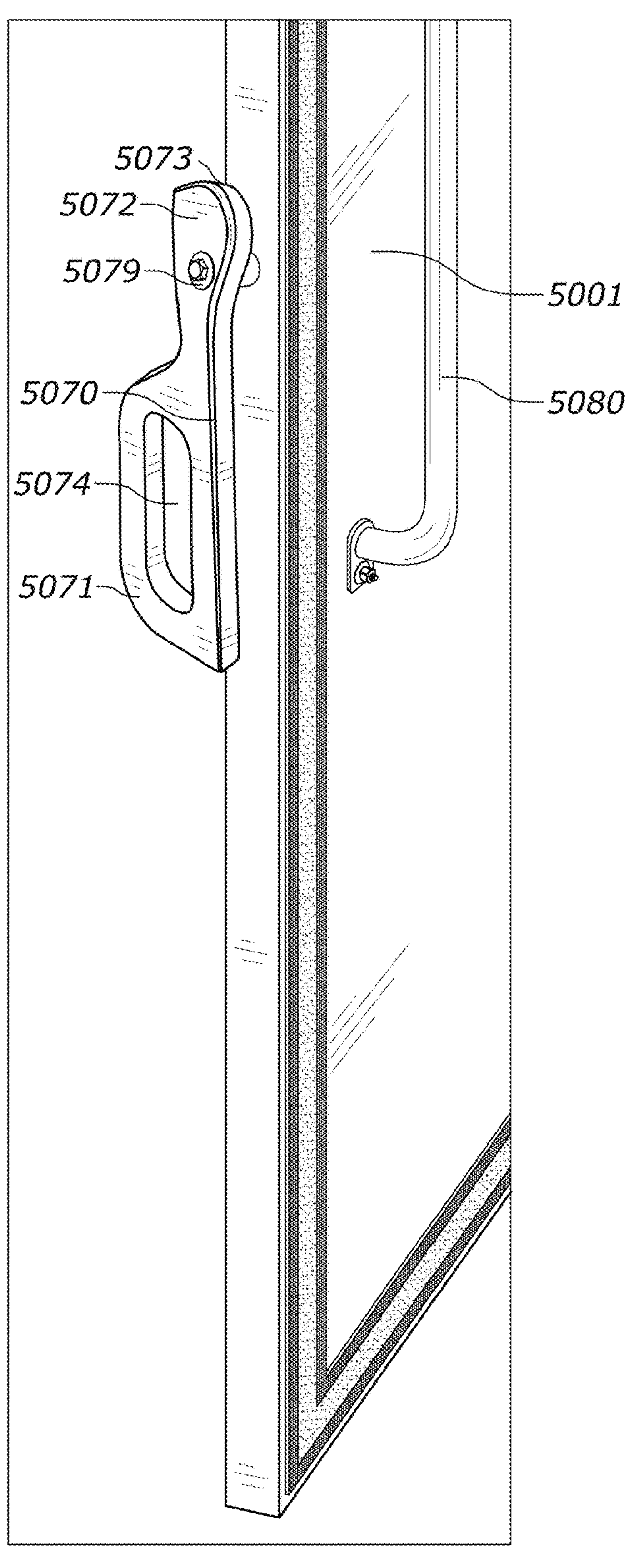
FIG. 5 illustrates a perspective cutaway view of a lever handle on an edge of the hardroom door according to embodiments of the present inventions.

FIG. 5 illustrates a perspective cutaway view of a lever handle on an edge of the hardroom door according to embodiments of the present inventions. In FIG. 5, cam exterior lever handle 5070 is pivotably attached to the side edge of the hardroom door 5001 according to embodiments of the present inventions. An interior pull handle 5080 is attached to the interior surface of hardroom door 5001. An exterior pull handle (not illustrated in FIGS. 5 and 6) is also attached to the exterior surface of hardroom door 5001.

The cam exterior lever handle 5070 has an exterior handle end 5071 and an opposing exterior forcing end 5072. The exterior handle end 5072 is substantially longer than the exterior forcing end 5071. The cam exterior lever handle 5070 is pivotably attached at an exterior pivot point 5079 between the exterior handle end 5071 and the exterior forcing 5072 end to a side edge of the hardroom door 5001. The exterior forcing end 5072 of the cam exterior lever handle 5070 has a cam surface 5073. The cam exterior lever handle 5070 can have a hand hold opening 5074 as illustrated. The hand hold opening 5074 makers for an easier grasp on the lever, especially when in a down position with the door closed. The hand hold opening 5074 is offset from a radius extending from the exterior pivot point 5079 of the cam exterior lever handle 5070.

Figure 6:
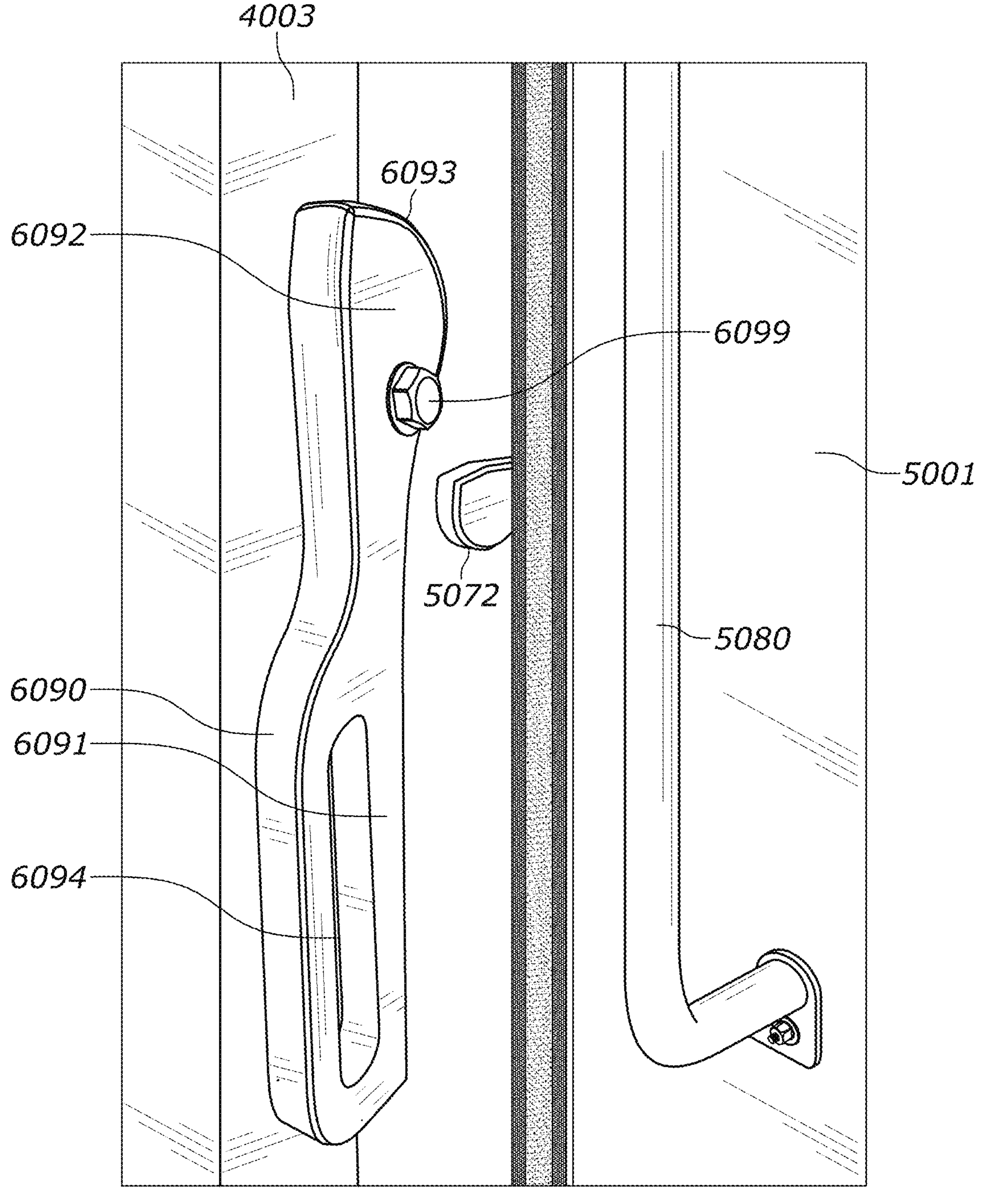
FIG. 6 illustrates a perspective cutaway view of another lever handle on a side of the door frame of FIG. 4 according to embodiments of the present inventions and FIG. 7 illustrates a perspective view of a front of the hardroom door hinged to the hardroom according to embodiments of the present inventions.

FIG. 6 illustrates a perspective cutaway view of an interior lever handle 6090 on the side of the door frame 4003 of FIG. 4 according to embodiments of the present inventions. A cam interior lever handle 6090 is pivotably attached to the door frame 6003. An interior push handle 5080 is attached to the interior surface of hardroom door 6001. A portion of the exterior forcing end 5072 of the cam exterior lever handle 5070 is seen in FIG. 6 behind the hardroom door 5001.

The cam interior lever handle 6090 has an interior handle end 6091 and an opposing interior forcing end 6092. The interior handle end 6091 is substantially longer than the interior forcing end 6092. The cam interior lever handle 6090 is pivotably attached at an interior pivot point 6099 between the interior handle end 6091 and the interior forcing end 6092 to the side of the door frame 4003. The interior forcing end 6092 of the cam exterior lever handle 5070 has a cam surface 6093. The cam interior lever handle 6090 can have a hand hold opening 6094 as illustrated. The hand hold opening 6094 makes for an easier grasp on the lever, especially when in a down position with the door closed. The hand hold opening 6094 is offset from a radius extending from the interior pivot point 6099 of the cam interior lever handle 6090.

Figure 7:
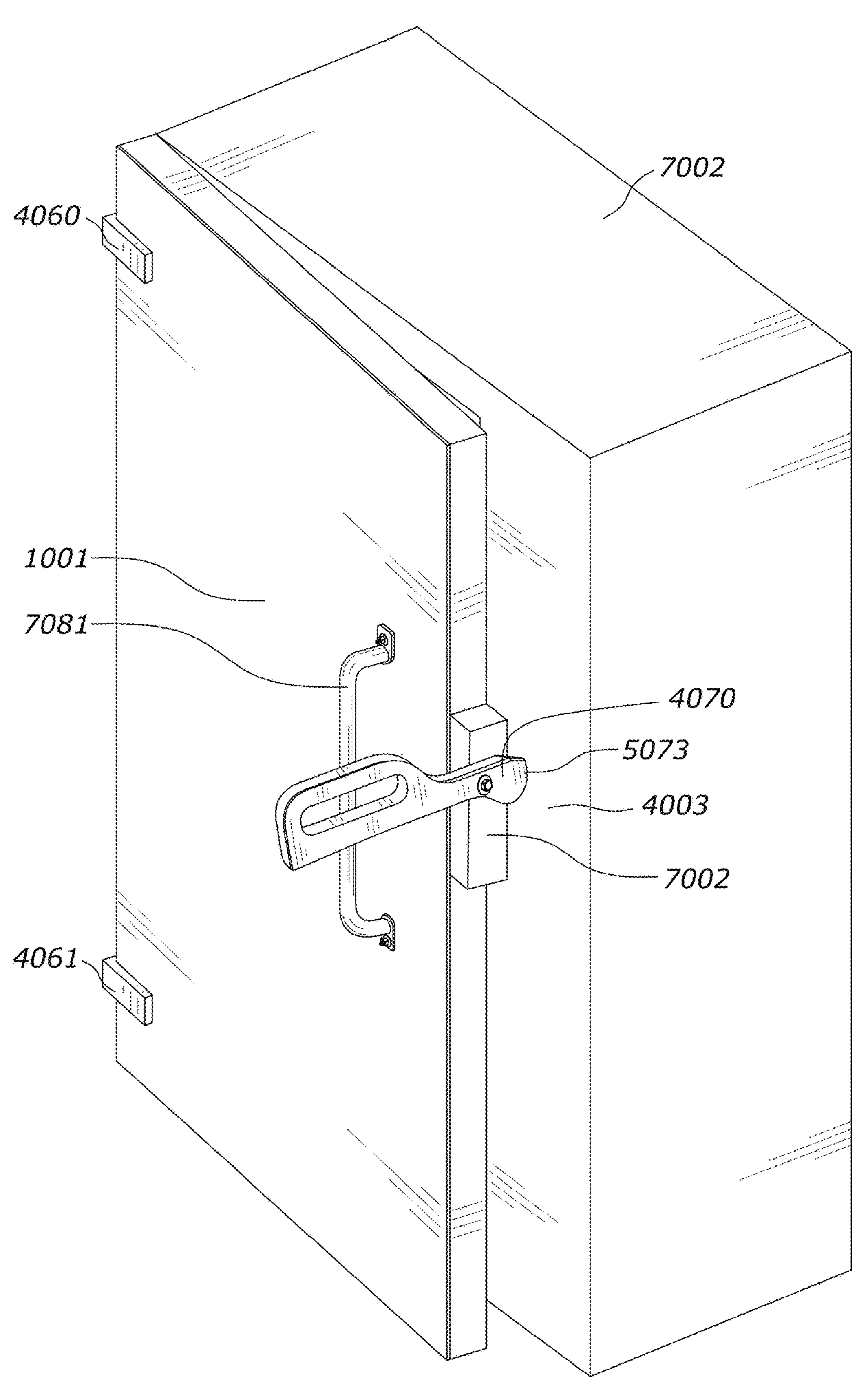

FIG. 7 illustrates a perspective view of a front of the hardroom door 1001 hinged to the hardroom 7002 according to embodiments of the present inventions. Hinges 4060, 4061 couple the hardroom door 1001 to the door frame 4003. An exterior pull handle 7081 is attached to the exterior surface of hardroom door 1001. A cam lever 4070 is rotatably attached to a side edge of the hardroom door 1001, located on the side opposite of the hinges 4060, 4061. In an alternative embodiment, a metal offsetting block 7002 is placed between the handle 4070 and an edge of the door 1001. The metal offsetting block 7002 places the cam surface 5073 of the cam lever 4070 further away from the edge of the door opening so that the forces by the cam lever 4070 are distributed more evenly on the frame 4003.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

"Reference characters corresponding to elements recited in the detailed description and the drawings may be used in conjunction with the recitation of the same element or group of elements in the claims. The reference characters, however, should be enclosed within parentheses so as to avoid confusion with other numbers or characters which may appear in the claims. The use of reference characters is to be considered as having no effect on the scope of the claims." The Manual of Patent Examining Procedure (MPEP) issued by the United States Patent and Trademark Office, chapter 608.01(m) (Form of Claims).

Any trademarks listed herein are the property of their respective owners, and reference herein to such trademarks is generally intended to indicate the source of a particular product or service.

The abstract and the title are provided to comply with the rules requiring an abstract and a title that will allow a searcher or other reader to quickly ascertain the subject matter of the technical disclosure. It is submitted with the understanding that they will not be used to interpret or limit the scope or meaning of the claims. 37 CFR 1.72(b).

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. An edge seal for a hardroom door in an electromagnetic shielded enclosure, the edge seal comprising:

a pair of fabric EMI gaskets running in parallel and adhered onto a perimeter of a conductive ferrous hardroom door surface; and a row of magnets running in between the pair of fabric EMI gaskets magnetically adhered onto the perimeter of the conductive ferrous hardroom door surface.

2. An edge seal for a hardroom door in an electromagnetic shielded enclosure according to claim 1, further comprising a strip of felted wool deployed on the row of magnets.

3. An edge seal for a hardroom door in an electromagnetic shielded enclosure according to claim 2, wherein the felted wool is a ferrous material and the row of magnets holds the felted wool.

4. An edge seal for a hardroom door in an electromagnetic shielded enclosure according to claim 2, wherein glue adheres the pair of fabric EMI gaskets onto the perimeter of the conductive ferrous hardroom door surface.

5. An edge seal for a hardroom door in an electromagnetic shielded enclosure according to claim 2, further comprising conductive non-ferrous spring clips deployed between the pair of fabric EMI gaskets and between the strip felted wool and the row of magnets in at least corners of the conductive ferrous hardroom door surface.

6. An edge seal for a hardroom door in an electromagnetic shielded enclosure according to claim 5, wherein each of the conductive non-ferrous spring clips are curved about 180 degrees to fit held between the row of magnets on a side and the conductive ferrous hardroom door surface and extend around with a spring to another, opposite side of the row of magnets.

7. An edge seal for a hardroom door in an electromagnetic shielded enclosure according to claim 1, wherein the row of magnets create at least about 200 lbs. force needing special handle to open door with lever handle.

8. An edge seal for a hardroom door in an electromagnetic shielded enclosure according to claim 1, wherein the edge seal for a hardroom door in an electromagnetic shielded enclosure further comprises a door frame comprising a conductive ferrous surface; and wherein the hardroom door comprises a row of magnets around a perimeter thereof and hinges coupling an edge of the hard room door to the door frame; and wherein the edge seal for a hardroom door in an electromagnetic shielded enclosure further comprises a lever rotatably attached between the hardroom door in a configuration to pry open and break magnetic forces between the row of magnets and the conductive ferrous surface of the door frame.

9. An edge seal for a hardroom door in an electromagnetic shielded enclosure according to claim 8, wherein the lever is a cam lever.

10. A hardroom door in an electromagnetic shielded enclosure according to claim 9, wherein the lever has a handle end and an opposing forcing end, the handle end is longer than the forcing end, and wherein the lever is pivotably attached at a pivot point between the handle end and the forcing end to a side edge of the hardroom door.

11. An edge seal for a hardroom door in an electromagnetic shielded enclosure according to claim 10, wherein the forcing end of the lever has a cam surface.

12. An edge seal for a hardroom door in an electromagnetic shielded enclosure according to claim 10, wherein another lever has another handle end and an opposing another forcing end, the another handle end is longer than the another forcing end, and wherein the another lever is pivotably attached at another pivot point between the handle end and the forcing end to a outer edge of the door frame.

13. An edge seal for a hardroom door in an electromagnetic shielded enclosure according to claim 12, wherein the forcing end of the lever has a cam surface; and wherein the another forcing end of the another lever has another cam surface.

14. An edge seal for a hardroom door in an electromagnetic shielded enclosure according to claim 8, wherein another lever has another handle end and an opposing another forcing end, the another handle end is longer than the another forcing end, and wherein the another lever is pivotably attached at another pivot point between the handle end and the forcing end to a outer edge of the door frame.

15. An edge seal for a hardroom door in an electromagnetic shielded enclosure according to claim 14, wherein the another forcing end of the another lever has another cam surface.

16. A hardroom door in an electromagnetic shielded enclosure, comprising:

a door frame comprising a conductive ferrous surface;

a hardroom door comprising a row of magnets around a perimeter thereof and hinges coupling an edge of the hard room door to the door frame; and a lever rotatably attached between the hardroom door in a configuration to pry open and break magnetic forces between the row of magnets and the conductive ferrous surface of the door frame.

17. A hardroom door in an electromagnetic shielded enclosure according to claim 16, wherein the lever is a cam lever.

18. A hardroom door in an electromagnetic shielded enclosure according to claim 16, wherein the lever has a handle end and an opposing forcing end, the handle end is longer than the forcing end, and wherein the lever is pivotably attached at a pivot point between the handle end and the forcing end to a side edge of the hardroom door.

19. A hardroom door in an electromagnetic shielded enclosure according to claim 18, wherein the forcing end of the lever has a cam surface.

20. A hardroom door in an electromagnetic shielded enclosure according to claim 18, wherein another lever has another handle end and an opposing another forcing end, the another handle end is longer than the another forcing end, and wherein the another lever is pivotably attached at another pivot point between the handle end and the forcing end to a outer edge of the door frame.

21. A hardroom door in an electromagnetic shielded enclosure according to claim 20, wherein the forcing end of the lever has a cam surface; and wherein the another forcing end of the another lever has another cam surface.

22. A hardroom door in an electromagnetic shielded enclosure according to claim 16, wherein another lever has another handle end and an opposing another forcing end, the another handle end is longer than the another forcing end, and wherein the another lever is pivotably attached at another pivot point between the handle end and the forcing end to a outer edge of the door frame.

23. A hardroom door in an electromagnetic shielded enclosure according to claim 22, wherein the another forcing end of the another lever has another cam surface.

24. A hardroom door in an electromagnetic shielded enclosure according to claim 16, further comprising a hand hold offset from a radius extending from a pivot point of the lever.

* * * * *